(12) United States Patent
Yang

(10) Patent No.: US 12,557,684 B2
(45) Date of Patent: Feb. 17, 2026

(54) BONDING PAD STRUCTURE AND METHOD FOR MANUFACTURING THE SAME

(71) Applicant: NANYA TECHNOLOGY CORPORATION, New Taipei (TW)

(72) Inventor: Wu-Der Yang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 651 days.

(21) Appl. No.: 17/866,732

(22) Filed: Jul. 18, 2022

(65) Prior Publication Data

US 2024/0021550 A1    Jan. 18, 2024

(51) Int. Cl.
*H01L 23/00* (2006.01)

(52) U.S. Cl.
CPC ............. *H01L 24/05* (2013.01); *H01L 24/03* (2013.01); *H01L 24/48* (2013.01);
(Continued)

(58) Field of Classification Search
CPC ......... H01L 24/05; H01L 24/03; H01L 24/48; H01L 2224/02331; H01L 2224/02373; H01L 2224/02381; H01L 2224/0239; H01L 2224/03416; H01L 2224/03452; H01L 2224/0362; H01L 2224/05008; H01L 2224/05017; H01L 2224/05076; H01L 2224/05083; H01L 2224/05147; H01L 2224/05155; H01L 2224/05548; H01L 2224/05557; H01L 2224/05573;
(Continued)

(56) References Cited

U.S. PATENT DOCUMENTS 6,656,827 B1 * 12/2003 Tsao ................. H01L 23/49838
257/E23.079
2004/0178503 A1 * 9/2004 Jin ......................... H01L 24/11
257/737

(Continued)

FOREIGN PATENT DOCUMENTS

CN     114424326 A    4/2022
TW     201304098 A    1/2013
(Continued)

OTHER PUBLICATIONS

Office Action and the search report mailed on Oct. 17, 2023 related to Taiwanese Application No. 112102117.
(Continued)

*Primary Examiner* — Teresa M. Arroyo
(74) *Attorney, Agent, or Firm* — Xuan Zhang

(57) ABSTRACT

A bonding pad structure and a method of manufacturing a bonding pad structure are provided. The bonding pad structure includes a carrier, a first conductive layer disposed over the carrier, a second conductive layer disposed on the first conductive layer and contacting the first conductive layer, and a third conductive layer disposed on the second conductive layer and contacting the second conductive layer. The bonding pad structure also includes a first passivation layer disposed on the first conductive layer and contacting at least one of the first conductive layer or the second conductive layer. An upper surface of the third conductive layer facing away from the carrier is exposed from the first passivation layer.

14 Claims, 19 Drawing Sheets

(52) U.S. Cl.
CPC ............... *H01L 2224/02331* (2013.01); *H01L 2224/02373* (2013.01); *H01L 2224/02381* (2013.01); *H01L 2224/0239* (2013.01); *H01L 2224/03416* (2013.01); *H01L 2224/03452* (2013.01); *H01L 2224/0362* (2013.01); *H01L 2224/05008* (2013.01); *H01L 2224/05017* (2013.01); *H01L 2224/05076* (2013.01); *H01L 2224/05083* (2013.01); *H01L 2224/05147* (2013.01); *H01L 2224/05155* (2013.01); *H01L 2224/05548* (2013.01); *H01L 2224/05557* (2013.01); *H01L 2224/05573* (2013.01); *H01L 2224/05644* (2013.01); *H01L 2224/48221* (2013.01); *H01L 2224/48464* (2013.01); *H01L 2224/48644* (2013.01); *H01L 2924/15151* (2013.01); *H01L 2924/15311* (2013.01); *H01L 2924/182* (2013.01); *H01L 2924/35121* (2013.01)

(58) Field of Classification Search
CPC . H01L 2224/05644; H01L 2224/48221; H01L 2224/48464; H01L 2224/48644; H01L 2924/15151; H01L 2924/15311; H01L 2924/182; H01L 2924/35121; H01L 24/11; H01L 24/13; H01L 2224/03019; H01L 2224/05098
See application file for complete search history.

(56) References Cited

U.S. PATENT DOCUMENTS

| | | | | |
|---|---|---|---|---|
| 2006/0246706 | A1* | 11/2006 | Ke | H01L 24/11 257/E21.508 |
| 2008/0081458 | A1* | 4/2008 | Lin | H01L 24/11 438/620 |
| 2008/0251916 | A1* | 10/2008 | Cheng | H01L 24/11 257/761 |
| 2009/0096098 | A1* | 4/2009 | Yang | H01L 23/5389 257/738 |
| 2011/0254161 | A1* | 10/2011 | Hu | H01L 23/49816 257/E23.021 |
| 2014/0054800 | A1* | 2/2014 | Gatterbauer | H01L 24/03 257/E21.59 |
| 2018/0226373 | A1 | 8/2018 | Lu et al. | |
| 2022/0352059 | A1* | 11/2022 | Kim | H01L 23/562 |
| 2023/0378107 | A1* | 11/2023 | Mao | H01L 23/5283 |

FOREIGN PATENT DOCUMENTS

| | | |
|---|---|---|
| TW | 201417234 A | 5/2014 |
| TW | 201834154 A | 9/2018 |

OTHER PUBLICATIONS

Office Action and the search report mailed on Dec. 19, 2023 related to Taiwanese Application No. 112141066.

* cited by examiner

BONDING PAD STRUCTURE AND METHOD FOR MANUFACTURING THE SAME

TECHNICAL FIELD

The present disclosure relates to a bonding pad structure and a method for manufacturing a bonding pad structure, and more particularly, to a bonding pad structure having a ladder shape.

DISCUSSION OF THE BACKGROUND

Wire-bonding process is widely used in the manufacture of semiconductor devices, being popular for advantages such as low cost, high flexibility, high reliability, and others. In a wire-bonding structure, a redistribution layer (RDL) may be formed over a substrate. A passivation layer may be disposed over the RDL to define bonding pads or input/output (I/O) pads. Bumps (such as gold bumps) may be bonded to the bonding pads.

Delamination or peeling may occur between different kinds of materials, such as between the passivation layer and the RDL. Furthermore, during a wire-bonding process, stress or force exerted on the bonding pads may further exacerbate delamination.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a bonding pad structure. The bonding pad structure includes a carrier, a first conductive layer disposed over the carrier, a second conductive layer disposed on the first conductive layer and contacting the first conductive layer, and a third conductive layer disposed on the second conductive layer and contacting the second conductive layer. The bonding pad structure also includes a first passivation layer disposed on the first conductive layer and contacting at least one of the first conductive layer or the second conductive layer. An upper surface of the third conductive layer facing away from the carrier is exposed from the first passivation layer.

Another aspect of the present disclosure provides a bonding pad structure. The bonding pad structure includes a dielectric layer having a surface, a copper-containing layer disposed on the surface of the dielectric layer, and a first passivation layer disposed over the copper-containing layer and defining an opening. The bonding pad structure also includes a gold-containing layer disposed in the opening. The gold-containing layer, the copper-containing layer, and the first passivation layer are non-overlapped along a direction substantially perpendicular to the surface of the dielectric layer.

Another aspect of the present disclosure provides a method of manufacturing a bonding pad structure. The method includes providing a carrier, forming a copper-containing layer over the carrier, forming a gold-containing layer over the copper-containing layer, and forming a passivation layer having a first opening to expose the gold-containing layer.

In some embodiments, the method further comprises: forming a conductive pad over the carrier; forming a dielectric layer on the conductive pad; and partially removing the dielectric layer to expose the conductive pad.

In some embodiments, the method further comprises: forming a first mask on the copper-containing layer to define a second opening; and forming a nickel-containing layer in the second opening.

In some embodiments, the method further comprises: forming a second mask on the copper-containing layer to define a third opening; and forming the gold-containing layer in the third opening.

According to some embodiments of the present disclosure, use of an RDL having a copper-containing layer and a gold-containing layer can improve electrical performance. In addition, since the gold-containing layer is not covered by a passivation layer, delamination between the gold-containing layer and the passivation layer can be minimized or prevented. Thus, the reliability of the bonding pad structure is improved.

The foregoing has outlined rather broadly the features and technical advantages of the present disclosure so that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1A:
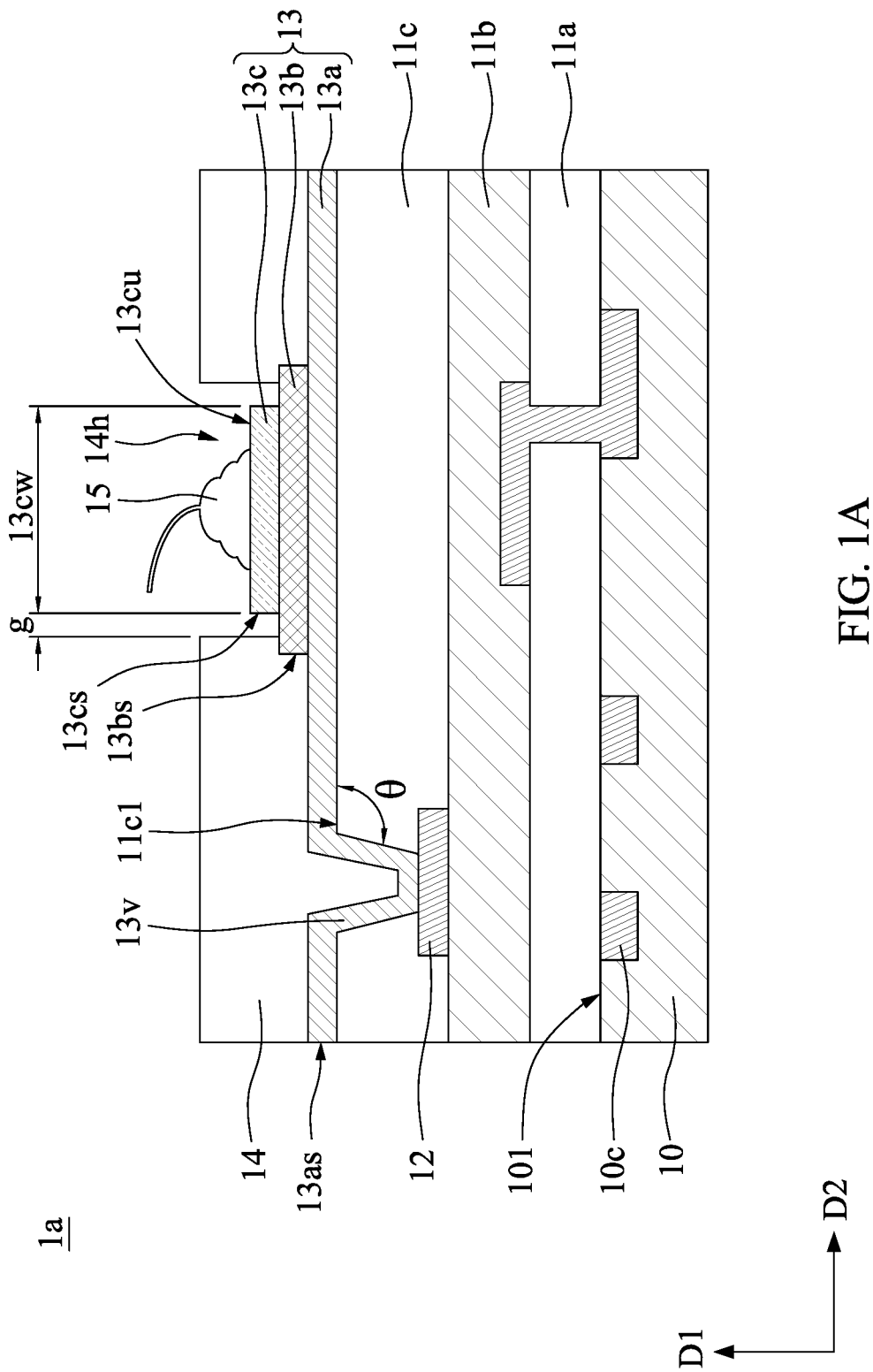
FIG. 1A is a schematic cross-sectional view of a bonding pad structure in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only, and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1A is a schematic cross-sectional view of a bonding pad structure 1a in accordance with some embodiments of the present disclosure.

The bonding pad structure 1a may include a carrier 10, dielectric layers 11a, 11b, 11c, a conductive pad 12, a redistribution layer (RDL) 13, a passivation layer 14, and a conductive bump 15.

The carrier 10 may include a substrate, such as a semiconductor substrate. In some embodiments, the carrier 10 may include, for example, silicon (Si), monocrystalline silicon, polysilicon, amorphous silicon, germanium (Ge), silicon germanium (SiGe), silicon carbide (SiC), silicon germanium carbide (SiGeC), gallium (Ga), gallium arsenide (GaAs), indium (In), indium arsenide (InAs), indium phosphide (InP) or other IV-IV, III-V or II-VI semiconductor materials. In some other embodiments, the carrier 10 may include a layered semiconductor such as silicon/silicon germanium, silicon-on-insulator, or silicon germanium-on-insulator.

In some embodiments, the carrier 10 may include a surface 101 substantially perpendicular to a direction or an axis "D1" and parallel to a direction or an axis "D2."

The dielectric layers 11a, 11b, and 11c may be stacked on the carrier 10 along the axis D1. In some embodiments, the dielectric layers 11a, 11b, and 11c may each include silicon oxide ($SiO_2$), silicon nitride ($Si_3N_4$), silicon oxynitride ($N_2OSi_2$), and silicon nitride oxide ($N_2OSi_2$), borophosphosilicate glass (BPSG), phosphosilicate glass (PSG), undoped silicon glass (USG), fluorosilicate glass (FSG), spin-on glass (SOG), or a combination thereof. It should be noted that while FIG. 1A illustrates three dielectric layers over the carrier 11, the bonding pad structure 1 could include any number of dielectric layers. The three dielectric layers are illustrated for simplicity.

Metal interconnections 11c may be provided in the carrier 10, between the carrier 10 and the dielectric layer 11a, and/or among the dielectric layers 11a, 11b, and 11c. Examples of the metal interconnections may include an RDL, a metal layer, a conductive trace, a conductive pad, a conductive via, a conductive pillar, and others.

Semiconductor devices may be provided in the carrier 10, between the carrier 10 and the dielectric layer 11a, and/or among the dielectric layers 11a, 11b, and 11c. Examples of the semiconductor devices may include an N-channel field effect transistor (NMOS), a P-channel field effect transistor (PMOS), a complementary field effect transistor (CMOS), and others.

The conductive pad 12 may be disposed over the surface 101 of the carrier 10. The conductive pad 12 may be disposed on one of the dielectric layers and covered by another one of the dielectric layers. The conductive pad 12 may be disposed on the dielectric layer 11b and covered by the dielectric layer 11c. The conductive pad 12 may be partially exposed from (or exposed by) the dielectric layer 11c.

The conductive pad 12 may include the topmost metal interconnection in the dielectric layers 11a, 11b, and 11c. In some embodiments, the conductive pad 12 may electrically connect to other parts of the metal interconnections 11c and/or the semiconductor devices.

In some embodiments, the conductive pad 12 may include a suitable conductive material. For example, the conductive pad 12 may include tungsten (W), copper (Cu), aluminum (Al), silver (Ag), an alloy thereof, or a combination thereof.

The RDL 13 may be disposed on the dielectric layer 11c and covered by the passivation layer 14. A portion 13v of the RDL 13 may penetrate or extend into the dielectric layer 11c to contact the conductive pad 12. The portion 13v may electrically connect to the conductive pad 12.

In some embodiments, the portion 13v may be a protrusion of the RDL 13 protruding, elongating or extending substantially along the axis D1. In some embodiments, the portion 13v may define an angle "θ" with a surface 11c1 (such as a top surface of the dielectric layer 11c facing away from the carrier 10) of the dielectric layer 11c. In some embodiments, the angle θ may be greater than or equal to 90 degrees. In some embodiments, the portion 13v may taper toward the conductive pad 12.

The RDL 13 may be used to transmit signals or connect to a power or ground reference. In some embodiments, the RDL 13 may be configured to electrically connect the conductive pad 12 to a power or ground reference.

The passivation layer 14 may be disposed on a part of the RDL 13. In some embodiments, the passivation layer 14 may be configured to protect the RDL 13, the underlying metal interconnections 11c and/or the semiconductor devices. In some embodiments, the passivation layer 14 may be configured to prevent the penetration of mobile ions, moisture, or other contaminations.

In some embodiments, the passivation layer 14 may include silicon oxide ($SiO_2$), silicon nitride ($Si_3N_4$), silicon oxynitride ($N_2OSi_2$), and silicon nitride oxide ($N_2OSi_2$), borophosphosilicate glass (BPSG), phosphosilicate glass (PSG), undoped silicon glass (USG), fluorosilicate glass (FSG), spin-on glass (SOG), or a combination thereof. In some embodiments, the passivation layer 14 may include a polymer, such as polyimide (PI) or photosensitive polyimide. The passivation layer 14 may include a single, double, or multilayered structure.

In some embodiments, the passivation layer 14 may define an opening or a hole 14h exposing a part of the RDL 13. The conductive bump 15 may be disposed on the exposed part of the RDL 13 in the opening 14h. In some embodiments, the passivation layer 14 may define more than one opening to distribute current carried by the RDL 13.

The RDL 13 may have a ladder or stepped shape. The RDL 13 may be multilayered. For example, the RDL 13 may include conductive layers 13a, 13b, and 13c. In some embodiments, the conductive layers 13a, 13b, and 13c may have dimensions (e.g., widths and/or lengths) different from one another. For example, the conductive layer 13a may be wider or longer than the conductive layers 13b and 13c. For example, the conductive layer 13b may be wider or longer than the conductive layer 13c.

In some embodiments, the conductive layer 13a may extend along the axis D2 between the passivation layer 14 and the dielectric layer 11c. In some embodiments, the conductive layer 13a may be disposed between the dielectric layer 11c and the passivation layer 14. In some embodiments, the conductive layer 13a may contact (such as directly contact) the dielectric layer 11c and the passivation layer 14.

In some embodiments, the conductive layer 13a may extend between the dielectric layer 11c and the conductive layer 13b. For example, the conductive layer 13a may pass under the conductive layer 13b. The conductive layer 13a may not be exposed by the opening 14h. For example, the conductive layer 13a may be covered by the conductive layers 13b and 13c.

In some embodiments, a portion (such as the portion 13v) of the conductive layer 13a may penetrate or extend into the dielectric layer 11c to contact the conductive pad 12. For example, the dielectric layer 11c may define a concave, a notch, or a groove recessed from the surface 11c1 of the dielectric layer 11c. In some embodiments, the conductive layer 13a may be partially disposed in the concave of the dielectric layer 11c. In some embodiments, the passivation layer 14 may be partially disposed in the concave of the dielectric layer 11c and surrounded by the conductive layer 13a.

In some embodiments, a lateral surface 13as of the conductive layer 13a may be substantially coplanar with a lateral surface of the passivation layer 14. In some embodiments, the lateral surface 13as of the conductive layer 13a may be substantially coplanar with a lateral surface of the dielectric layer 11c.

In some embodiments, the conductive layer 13b may be disposed between the conductive layer 13a and the conductive layer 13c. In some embodiments, the conductive layer 13b may contact (such as directly contact) the conductive layer 13a and the conductive layer 13c. In some embodiments, the conductive layer 13b may be disposed between the conductive layer 13a and the passivation layer 14. In some embodiments, the conductive layer 13b may contact (such as directly contact) the conductive layer 13a and the passivation layer 14.

In some embodiments, the conductive layer 13b may be partially covered by the conductive layer 13c. In some embodiments, a central line of the conductive layer 13b may be aligned with a central line of the conductive layer 13c. In some embodiments, the conductive layer 13b may be partially exposed from the opening 14h. In some embodiments, a central line of the conductive layer 13b may be aligned with a central line of the opening 14h.

In some embodiments, a part of the conductive layer 13b may be covered by the passivation layer 14. For example, a periphery of the conductive layer 13b may be covered by the passivation layer 14. For example, a ladder or stepped shape of the conductive layer 13b may be covered by the passivation layer 14.

For example, a lateral surface 13bs of the conductive layer 13b may be covered by the passivation layer 14. In some embodiments, the lateral surface 13bs of the conductive layer 13b may be substantially perpendicular to the surface 11c1 of the dielectric layer 11c or may be substantially aligned to the axis D1.

In some embodiments, the conductive layer 13b may be spaced apart from the conductive pad 12. For example, the conductive layer 13b may not overlap with the conductive pad 12 in the axis D1.

In some embodiments, the lateral surface 13bs of the conductive layer 13b and the lateral surface 13as of the conductive layer 13a may not be coplanar. For example, the lateral surface 13bs of the conductive layer 13b may be spaced apart from the lateral surface 13as of the conductive layer 13a. For example, a distance between the lateral surface 13bs of the conductive layer 13b and a lateral surface 13cs of the conductive layer 13c may be less than a distance between the lateral surface 13as of the conductive layer 13a and the lateral surface 13cs of the conductive layer 13c.

In some embodiments, the conductive layer 13c may be disposed on the conductive layer 13b. In some embodiments, the conductive layer 13c may contact (such as directly contact) the conductive layer 13b. In some embodiments, the conductive layer 13c may include the topmost layer of the RDL 13. In some embodiments, the conductive layer 13c may extend into or penetrate the passivation layer 14 to form or function as a bonding pad or land for receiving or bonding the conductive bump 15.

In some embodiments, the conductive layer 13c may be surrounded by the passivation layer 14. In some embodiments, the conductive layer 13c may be exposed (such as entirely exposed) from the opening 14h of the passivation layer 14. For example, the conductive layer 13c may not be covered by the passivation layer 14. In some embodiments, an upper surface 13cu of the conductive layer 13c facing away from the carrier 10 may be exposed (such as entirely exposed) from the opening 14h of the passivation layer 14. In some embodiments, a ladder or stepped shape of the conductive layer 13c may be exposed (such as entirely exposed) from the opening 14h of the passivation layer 14.

In some embodiments, the conductive layer 13c and the passivation layer 14 may not overlap along the axis D1. For example, the conductive layer 13c may not be disposed between the conductive layer 13b and the passivation layer 14. For example, the conductive layer 13c may not be disposed between the conductive layer 13a and the passivation layer 14.

In some embodiments, the conductive layer 13c may be spaced apart from the passivation layer 14. For example, the conductive layer 13c may not contact the passivation layer 14. For example, the conductive layer 13c may be physically separated from the passivation layer 14. For example, the conductive layer 13c may be spaced apart from the passivation layer 14 by a distance or a gap "g" between about 1.0 micrometers (μm) and about 3.0 μm.

In some embodiments, the conductive layer 13c may have a width 13cw between about 40.0 μm and about 60.0 μm, such as about μm.

In some embodiments, the conductive layer 13c may be spaced apart from the conductive pad 12. For example, the conductive layer 13c may not overlap with the conductive pad 12 in the axis D1.

In some embodiments, the lateral surface 13cs of the conductive layer 13c and the lateral surface 13bs of the conductive layer 13b may not be coplanar. For example, the lateral surface 13cs of the conductive layer 13c may be spaced apart from the lateral surface 13bs of the conductive layer 13b. In some embodiments, the lateral surface 13cs of the conductive layer 13c may be substantially perpendicular to the surface 11c1 of the dielectric layer 11c or may be substantially aligned to the axis D1.

In some embodiments, the conductive layers 13a, 13b, and 13c may have materials different from one another.

In some embodiments, the conductive layer 13a may include a copper-containing layer. For example, the conductive layer 13a may include about 50, 60, 70, 80, or 90 weight percent (wt %) of copper (Cu) or more.

In some embodiments, the conductive layer 13b may include a nickel-containing layer. For example, the conductive layer 13b may include about 50, 60, 70, 80, or 90 wt % nickel (Ni) or more.

In some embodiments, the conductive layer 13c may include a gold-containing layer. For example, the conductive layer 13c may include about 50, 60, 70, 80, or 90 wt % gold (Au) or more.

In some embodiments, the conductive bump 15 may contact (such as directly contact) the conductive layer 13c. In some embodiments, the conductive bump 15 may cover at least about 60% of the surface area (such as the area of the upper surface 13cu) of the conductive layer 13c. For example, about 60% or more of the surface area of the conductive layer 13c may be covered by the conductive bump 15.

In some embodiments, the conductive bump 15 may include reflowable or solder bump. The reflowable bump includes solder or other metals or alloys with a melting point of between 150 and 350° C. The reflowable bump includes a lead-containing solder material, such as tin-lead alloy, or a lead-free solder material, such as tin-silver alloy or tin-silver-copper alloy at the topmost of the reflowable bump.

In some embodiments, the conductive bump 15 may include non-reflowable or non-solder bump. The non-reflowable bump includes metals or metal alloys with a melting point exceeding 350° C., 400° C., or 600° C. In some embodiments, the conductive bump 15 may include a gold bump. In some embodiments, a topmost metal layer of the conductive bump 15 may include about 50, 60, 70, 80, or 90 wt % gold (Au) or more.

According to some embodiments of the present disclosure, use of an RDL having a copper-containing layer and a gold-containing layer can improve electrical performance. In addition, since the gold-containing layer is not covered by a passivation layer, delamination between the gold-containing layer and the passivation layer can be minimized or prevented. Thus, the reliability of the bonding pad structure is improved.

Figure 1B:
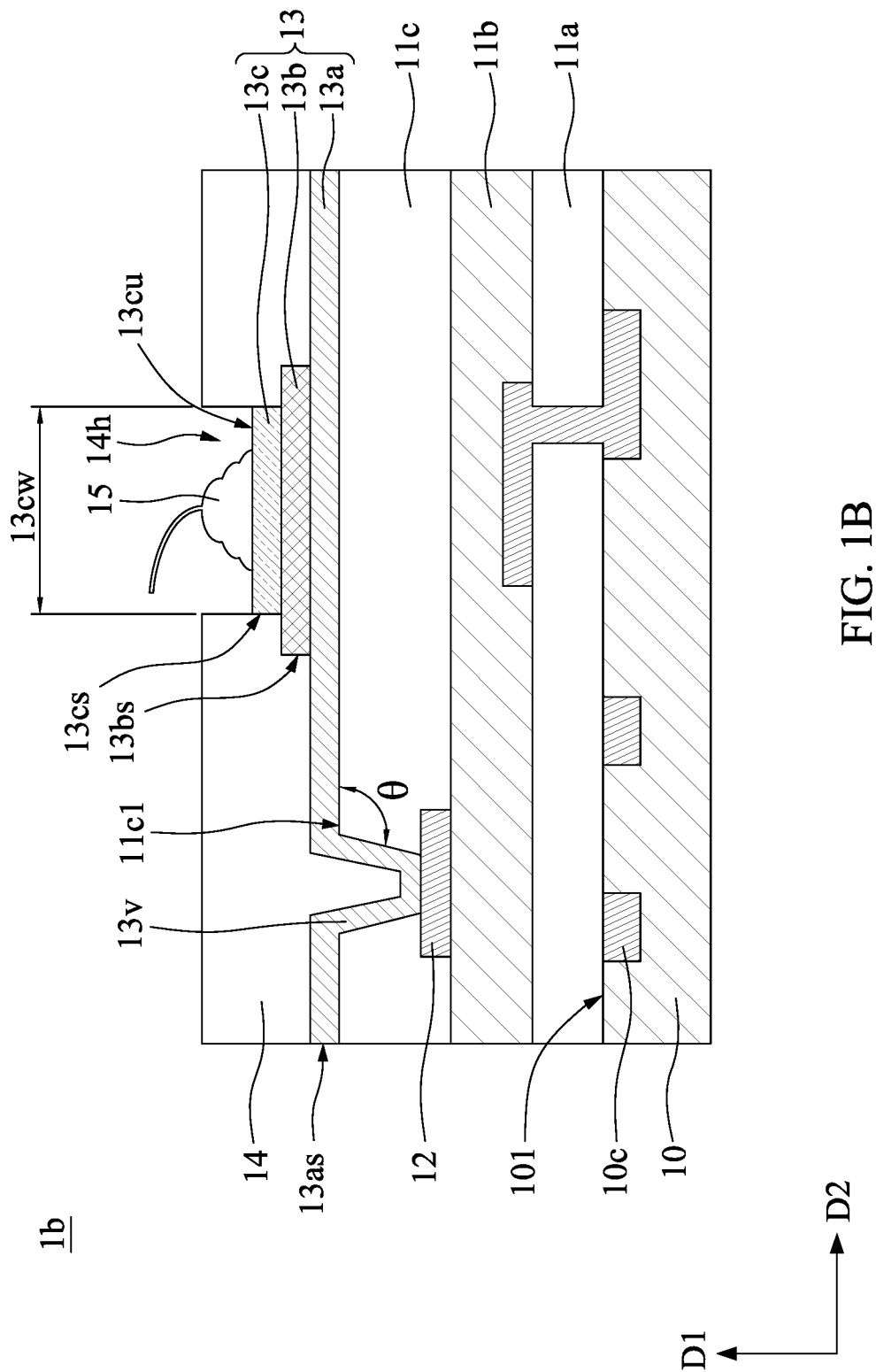
FIG. 1B is a schematic cross-sectional view of a bonding pad structure in accordance with some embodiments of the present disclosure.

FIG. 1B is a schematic cross-sectional view of a bonding pad structure 1b in accordance with some embodiments of the present disclosure. The bonding pad structure 1b of FIG. 1B is similar to the bonding pad structure 1a of FIG. 1A, with differences therebetween as follows.

In some embodiments, the conductive layer 13b may not be exposed from the opening 14h. The conductive layer 13b may be covered by the conductive layer 13c and the passivation layer 14. The conductive layer 13b in the opening 14h may be entirely covered by the conductive layer 13c.

In some embodiments, the lateral surface 13cs of the conductive layer 13c may contact the passivation layer 14. In some embodiments, the lateral surface 13cs of the conductive layer 13c may contact the internal surface of the opening 14h. There may be no gap between the conductive layer 13c and the passivation layer 14.

Figure 1C:
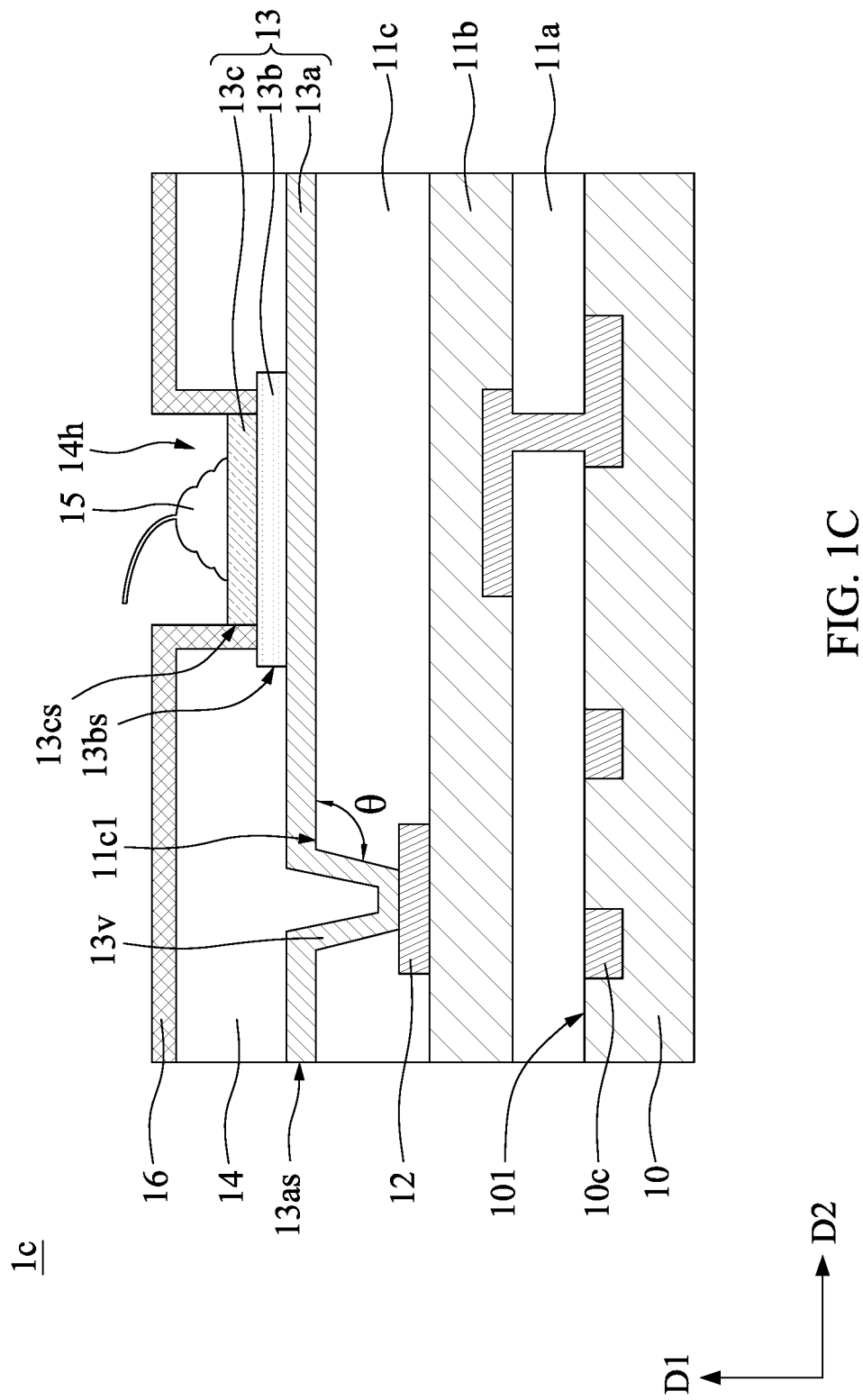
FIG. 1C is a schematic cross-sectional view of a bonding pad structure in accordance with some embodiments of the present disclosure.

FIG. 1C is a schematic cross-sectional view of a bonding pad structure 1c in accordance with some embodiments of the present disclosure. The bonding pad structure 1c of FIG. 1C is similar to the bonding pad structure 1a of FIG. 1A, with differences therebetween as follows.

The bonding pad structure 1c further includes a passivation layer 16. The passivation layer 16 may be disposed on the passivation layer 14. The passivation layer 16 may be disposed between the lateral surface 13cs of the conductive layer 13c and the passivation layer 14. The lateral surface 13cs of the conductive layer 13c may contact the passivation layer 16. The passivation layer 16 may define the internal surface of the opening 14h. There may be no gap between the conductive layer 13c and the passivation layer 16.

In some embodiments, the conductive layer 13b may not be exposed from the opening 14h. The conductive layer 13b may be covered by the conductive layer 13c, the passivation layer 14 and the passivation layer 16.

In some embodiments, the conductive layer 13c and the passivation layer 16 may not overlap along the axis D1. For example, the conductive layer 13c may not be disposed between the conductive layer 13b and the passivation layer 16. For example, the conductive layer 13c may not be disposed between the conductive layer 13a and the passivation layer 16.

In some embodiments, the passivation layer 16 may include silicon oxide ($SiO_2$), silicon nitride ($Si_3N_4$), silicon oxynitride ($N_2OSi_2$), and silicon nitride oxide ($N_2OSi_2$), borophosphosilicate glass (BPSG), phosphosilicate glass (PSG), undoped silicon glass (USG), fluorosilicate glass (FSG), spin-on glass (SOG), or a combination thereof. In some embodiments, the passivation layer 16 may include a polymer, such as polyimide (PI) or photosensitive polyimide. The passivation layer 16 may include a single, double, or multilayered structure.

Figure 1D:
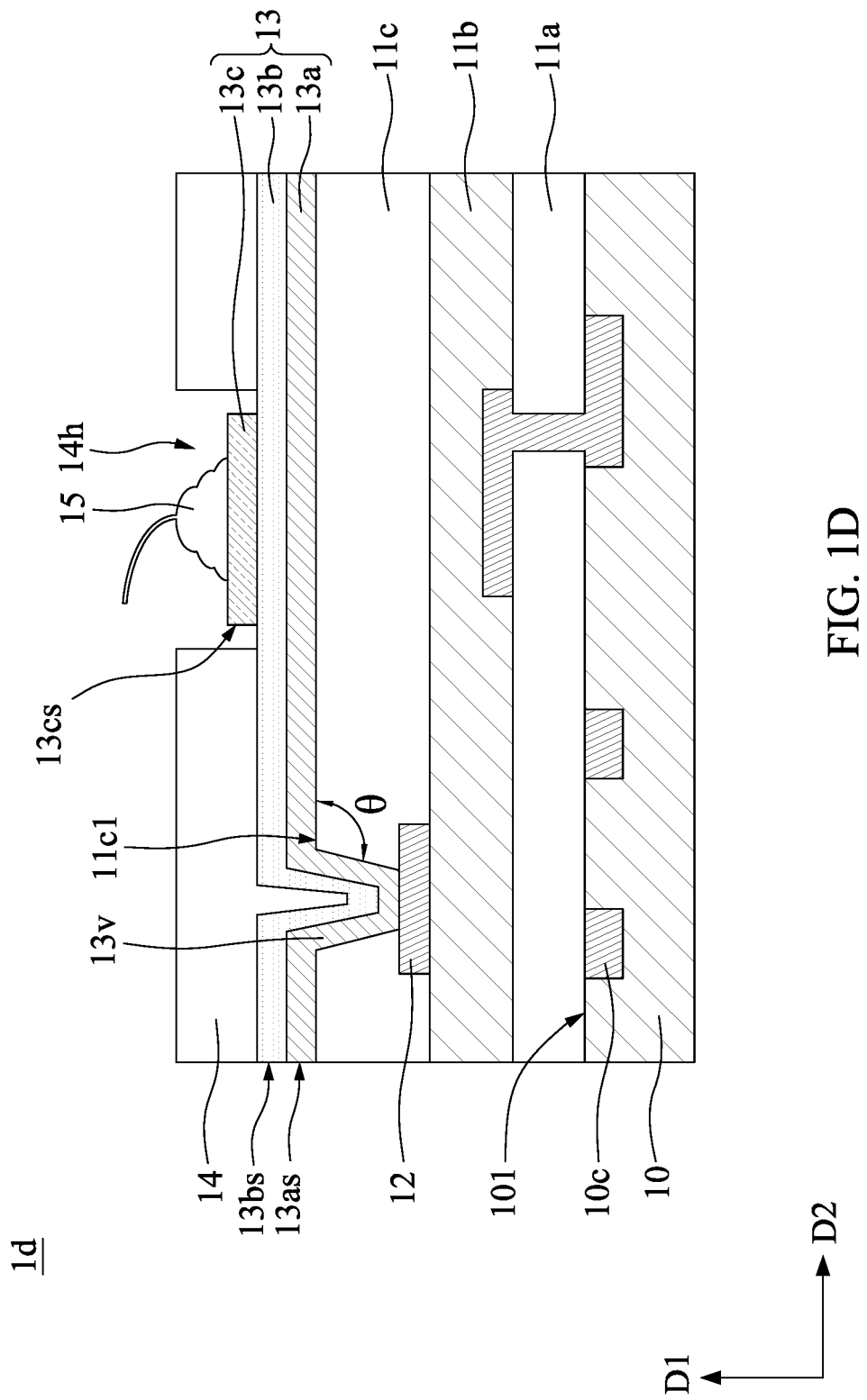
FIG. 1D is a schematic cross-sectional view of a bonding pad structure in accordance with some embodiments of the present disclosure.

FIG. 1D is a schematic cross-sectional view of a bonding pad structure 1d in accordance with some embodiments of the present disclosure. The bonding pad structure 1d of FIG. 1D is similar to the bonding pad structure 1a of FIG. 1A, with differences therebetween as follows.

In some embodiments, a portion (such as the portion 13v) of the conductive layer 13b may penetrate or extend into the dielectric layer 11c. For example, the dielectric layer 11c may define a concave, a notch, or a groove recessing from the surface 11c1 of the dielectric layer 11c. In some embodiments, the conductive layer 13a may be partially disposed in the concave of the dielectric layer 11c. In some embodiments, the conductive layer 13b may be partially disposed in the concave of the dielectric layer 11c and surrounded by the conductive layer 13a. In some embodiments, the passivation layer 14 may be partially disposed in the concave of the dielectric layer 11c and surrounded by the conductive layer 13b.

In some embodiments, the lateral surface 13bs of the conductive layer 13b may be substantially coplanar with a lateral surface of the passivation layer 14. In some embodiments, the lateral surface 13bs of the conductive layer 13b may be substantially coplanar with a lateral surface of the dielectric layer 11c.

In some embodiments, the conductive layer 13b may be disposed between the conductive layer 13a and the passivation layer 14. In some embodiments, the conductive layer 13a may not contact the passivation layer 14. In some embodiments, the conductive layer 13a may be physically separated from the passivation layer 14 by the conductive layer 13b.

Figure 1E:
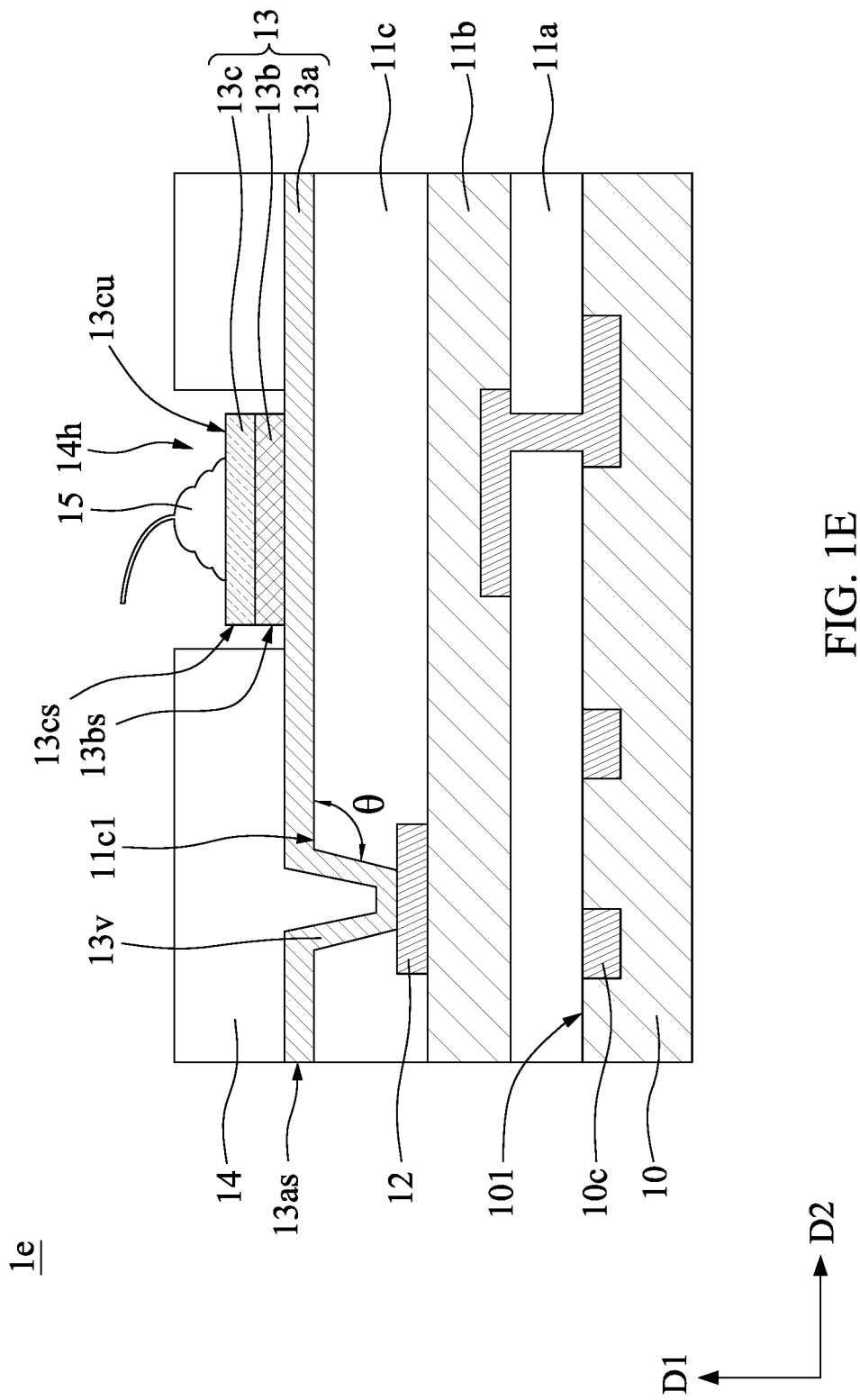
FIG. 1E is a schematic cross-sectional view of a bonding pad structure in accordance with some embodiments of the present disclosure.

FIG. 1E is a schematic cross-sectional view of a bonding pad structure 1e in accordance with some embodiments of the present disclosure. The bonding pad structure 1e of FIG. 1E is similar to the bonding pad structure 1a of FIG. 1A, with differences therebetween as follows.

In some embodiments, the conductive layer 13b may be exposed (such as entirely exposed) from the opening 14h of the passivation layer 14. For example, the conductive layer 13b may not be covered by the passivation layer 14.

In some embodiments, the conductive layer 13b and the passivation layer 14 may not overlap along the axis D1. For example, the conductive layer 13b may not be disposed between the conductive layer 13a and the passivation layer 14.

In some embodiments, the conductive layer 13b may be spaced apart from the passivation layer 14. For example, the conductive layer 13b may not contact the passivation layer 14. For example, the conductive layer 13b may be physically separated from the passivation layer 14.

In some embodiments, the lateral surface 13cs of the conductive layer 13c and the lateral surface 13bs of the conductive layer 13b may be substantially coplanar.

Figure 1F:
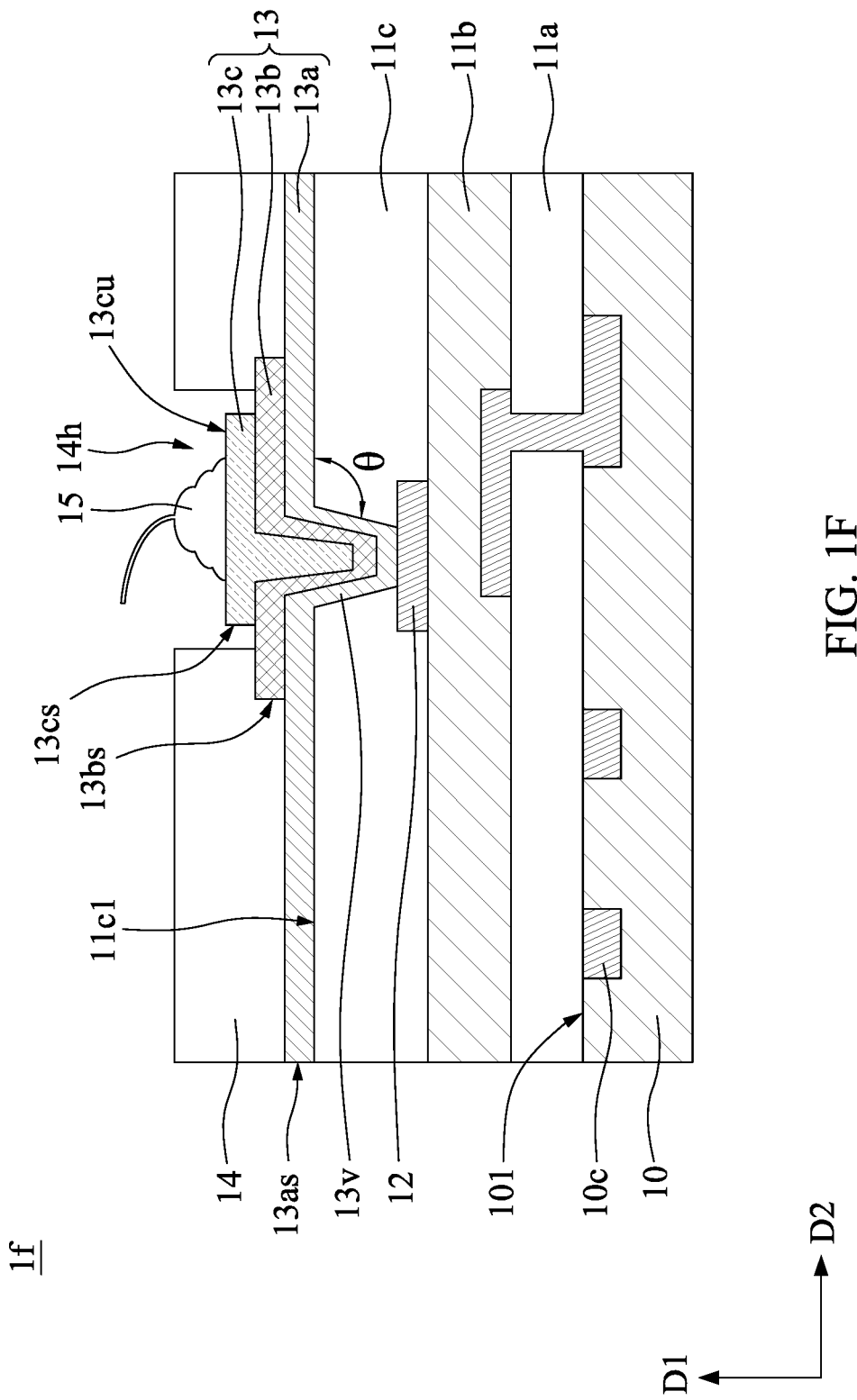
FIG. 1F is a schematic cross-sectional view of a bonding pad structure in accordance with some embodiments of the present disclosure.

FIG. 1F is a schematic cross-sectional view of a bonding pad structure 1f in accordance with some embodiments of the present disclosure. The bonding pad structure 1f of FIG. 1F is similar to the bonding pad structure 1a of FIG. 1A, with differences therebetween as follows.

In some embodiments, the conductive layer 13c may overlap with the conductive pad 12 along the axis D1.

In some embodiments, a portion of the conductive layer 13c may penetrate or extend into the dielectric layer 11c.

For example, the dielectric layer 11c may define a concave, a notch, or a groove recessing from the surface 11c1 of the dielectric layer 11c. In some embodiments, the conductive layer 13a may be partially disposed in the concave of the dielectric layer 11c. In some embodiments, the conductive layer 13b may be partially disposed in the concave of the dielectric layer 11c and surrounded by the conductive layer 13a. In some embodiments, the conductive layer 13c may be partially disposed in the concave of the dielectric layer 11c and surrounded by the conductive layer 13b.

Figure 2:
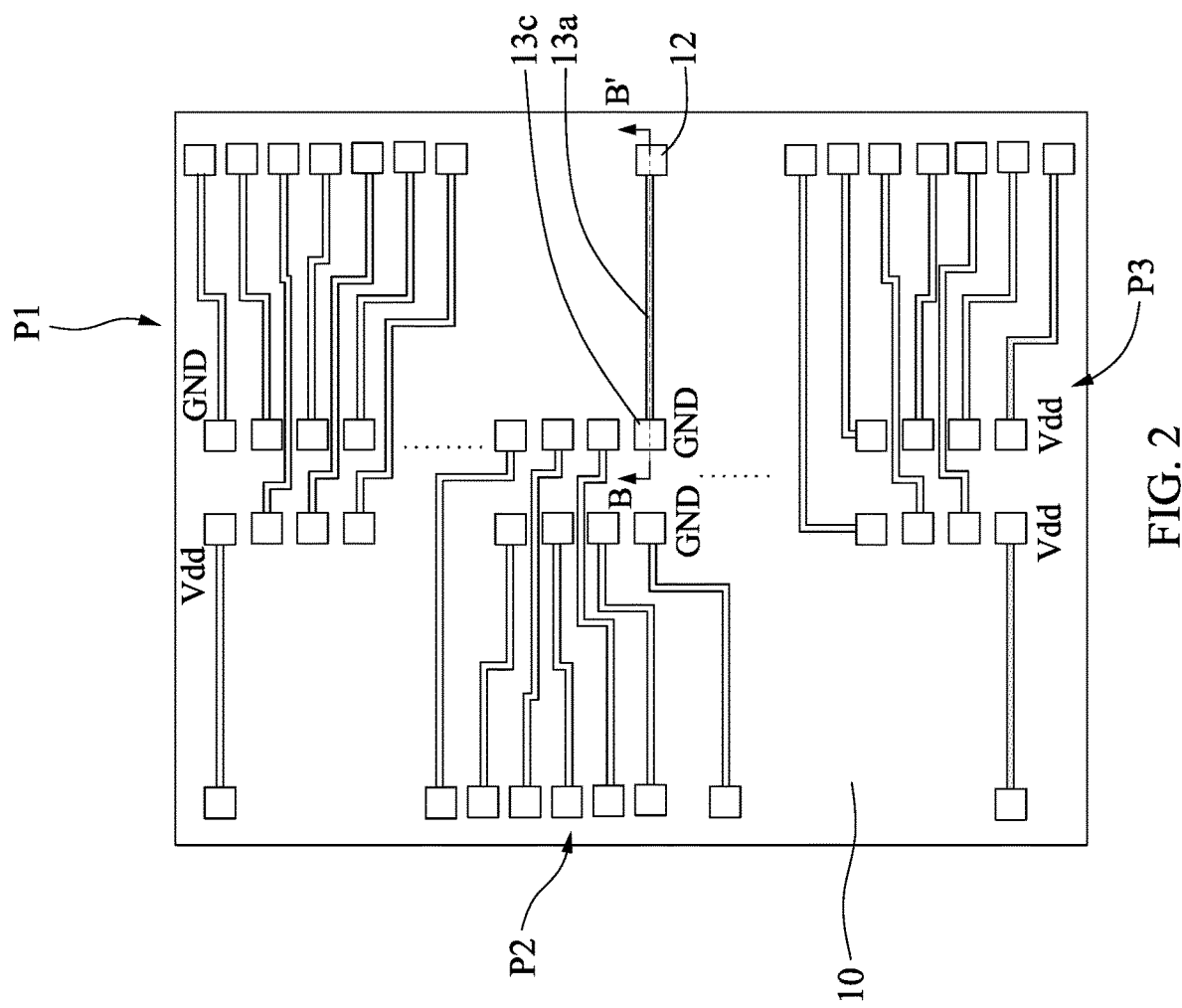
FIG. 2 is a schematic top view of a semiconductor device package in accordance with some embodiments of the present disclosure.

FIG. 2 is a schematic top view of a semiconductor device package 2 in accordance with some embodiments of the present disclosure. In some embodiments, the bonding pad structures 1a, 1b, 1c, 1d, 1e, or 1f may be a schematic cross-sectional view along line BB' in FIG. 2. In some embodiments, some elements in FIG. 2 have been simplified or not shown for a better understanding of the aspects of the present disclosure.

The semiconductor device package 2 may include the carrier 10 and a plurality of input/output (I/O) pins. For example, I/O pins groups P1, P2 and P3 may be provided on the carrier 10. In some embodiments, the I/O pins groups P1 and P3 may be configured for data input and output. In some embodiments, the I/O pins group P2 may include command and address pins. However, in some other embodiments, the I/O pins groups P1, P2 and P3 may have different functions and are not limited thereto.

The conductive layer 13c may be exposed by an opening (such as the opening 14h in FIG. 1A) and configured to function as an I/O pin. The I/O pin may be electrically connected through a conductive bump (such as the conductive bump 15 in FIG. 1A) and a bonding wire to a ground reference node (GND), an electrical power node (Vdd) or a voltage node. Although the conductive layer 13c is illustrated as a GND pin in FIG. 2, the conductive layer 13c may have different functions and are not limited thereto.

The conductive layer 13a may extend between the conductive layer 13c and the conductive pad 12. The conductive layer 13a may electrically connect the conductive layer 13c to the conductive pad 12. The conductive layer 13c may not extend with the conductive layer 13a. The conductive layer 13a may provide an electrical path for the conductive layer 13c.

Figure 3:
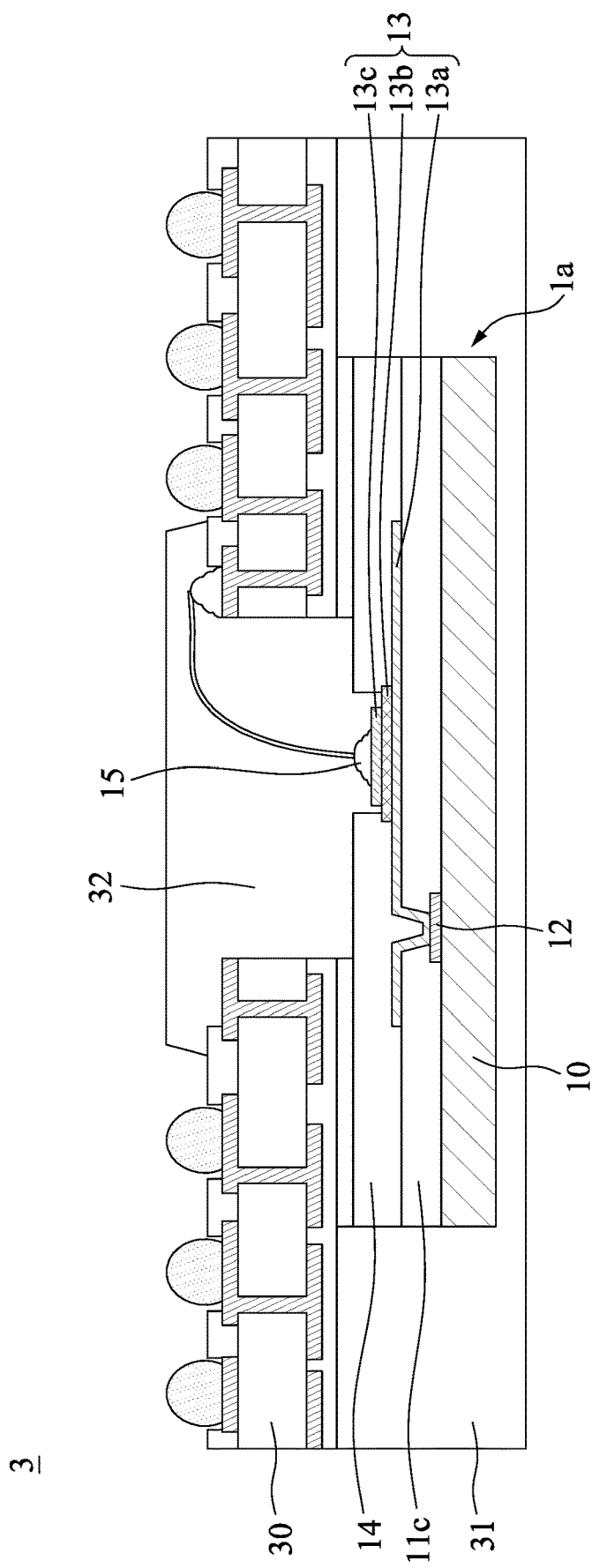
FIG. 3 is a schematic cross-sectional view of a semiconductor device package in accordance with some embodiments of the present disclosure.

FIG. 3 is a schematic cross-sectional view of a semiconductor device package 3 in accordance with some embodiments of the present disclosure. In some embodiments, the bonding pad structures 1a, 1b, 1c, 1d, 1e, or 1f may be an enlarged view in FIG. 3.

In some embodiments, the semiconductor device package 3 may include a window ball grid array (WBGA) package. In some embodiments, the semiconductor device package 3 may include the bonding pad structure 1a, a carrier 30, and package bodies 31, 32. The dielectric layers 11a and 11b are omitted in FIG. 3.

The carrier 30 may include a substrate. In some embodiments, the carrier 30 may include semiconductor material such as silicon, germanium, gallium, arsenic, or combinations thereof. In some embodiments, the carrier 30 may include plastic materials, ceramic materials or the like.

The carrier 30 may include interconnections, circuitries or layout circuits, such as one or more vias and one or more conductive lines (or conductive traces). Electrical contacts may be disposed on a surface of the carrier 30. The electrical contacts may include a controlled collapse chip connection (C4) bump, a ball grid array (BGA) or a land grid array (LGA).

In some embodiments, the carrier 30 may include or define a through hole penetrating or traversing through the carrier 30. The through hole may include a window opening, an opening, or a slot provided at the center of the carrier 30.

The bonding pad structure 1a may be disposed on the carrier 30. The bonding pad structure 1a may cover an end of the through hole of the carrier 30. A central portion of the bonding pad structure 1a may face or be exposed from the through hole of the carrier 30. In some embodiments, the conductive layer 13c and the carrier 30 may be electrically connected through a bonding wire.

In some embodiments, the bonding pad structure 1a may include or be a part of an electronic component. In some embodiments, the electronic component may include a semiconductor die or a chip, such as a memory die (e.g., dynamic random access memory (DRAM) die, static random access memory (SRAM) die, and others), a signal processing die (e.g., digital signal processing (DSP) die), a logic die (e.g., application processor (AP), system-on-a-chip (SoC), central processing unit (CPU), graphics processing unit (GPU), microcontroller, and others), a power management die (e.g., power management integrated circuit (PMIC) die), a radio frequency (RF) die, a sensor die, a micro-electro-mechanical-system (MEMS) die, a front-end die (e.g., analog front-end (AFE) dies) or other active components.

The package body 31 may be disposed on the carrier 30 to encapsulate or cover the bonding pad structure 1a. The package body 32 may be disposed in the through hole of the carrier 30. The package body 32 may fill the through hole of the carrier 30. The package body 32 may be disposed on, cover, or contact a part of the bonding pad structure 1a. The package body 32 may be disposed on, cover, or contact a part of the conductive layer 13c. The package body 32 may be disposed on, cover, or contact a part of the conductive layer 13b.

In some embodiments, the package body 31 may include molding material, such as a Novolac-based resin, an epoxy-based resin, a silicone-based resin, or other suitable encapsulant. Suitable fillers may also be included, such as powdered $SiO_2$. In some embodiments, the package body 31 and the package body 32 may include the same material. In some embodiments, the package body 31 and the package body 32 may include different materials.

FIGS. 4A, 4B, 4C, 4D, 4E, 4F, 4G, 4H, 4I, and 4J illustrate stages of a method of manufacturing a bonding pad structure in accordance with some embodiments of the present disclosure. At least some of these figures have been simplified for a better understanding of the aspects of the present disclosure. In some embodiments, the bonding pad structure 1a in FIG. 1A may be manufactured by the operations described herein with respect to FIGS. 4A, 4B, 4C, 4D, 4E, 4F, 4G, 4H, 4I, and 4J.

Figure 4A:
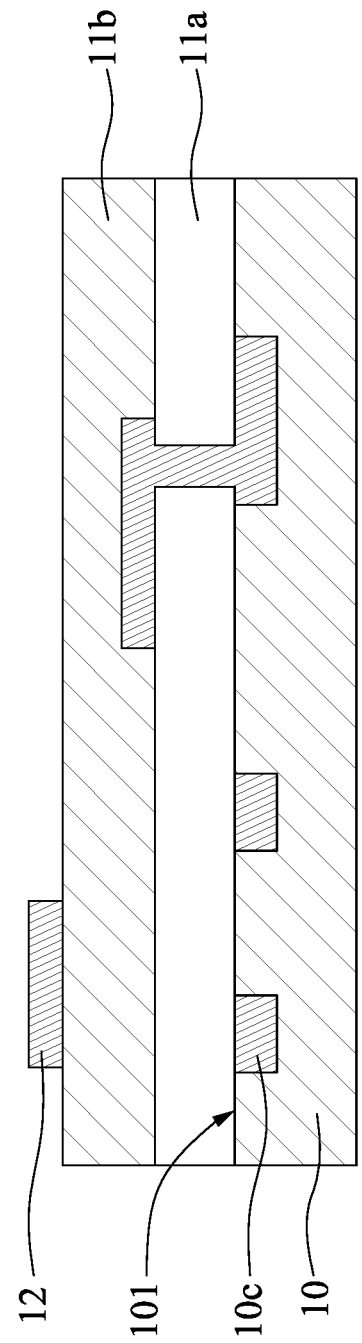
FIG. 4A illustrates one or more stages of a method of manufacturing a bonding pad structure in accordance with some embodiments of the present disclosure.

Referring to FIG. 4A, the carrier 10 may be provided. The dielectric layers 11a and 11b may be stacked on the carrier 10. The metal interconnections 10c may be provided in the carrier 10, between the carrier 10 and the dielectric layer 11a, and/or between the dielectric layers 11a and 11b.

The conductive pad 12 may be provided or disposed over the carrier 10. The conductive pad 12 may include the topmost metal interconnection.

Figure 4B:
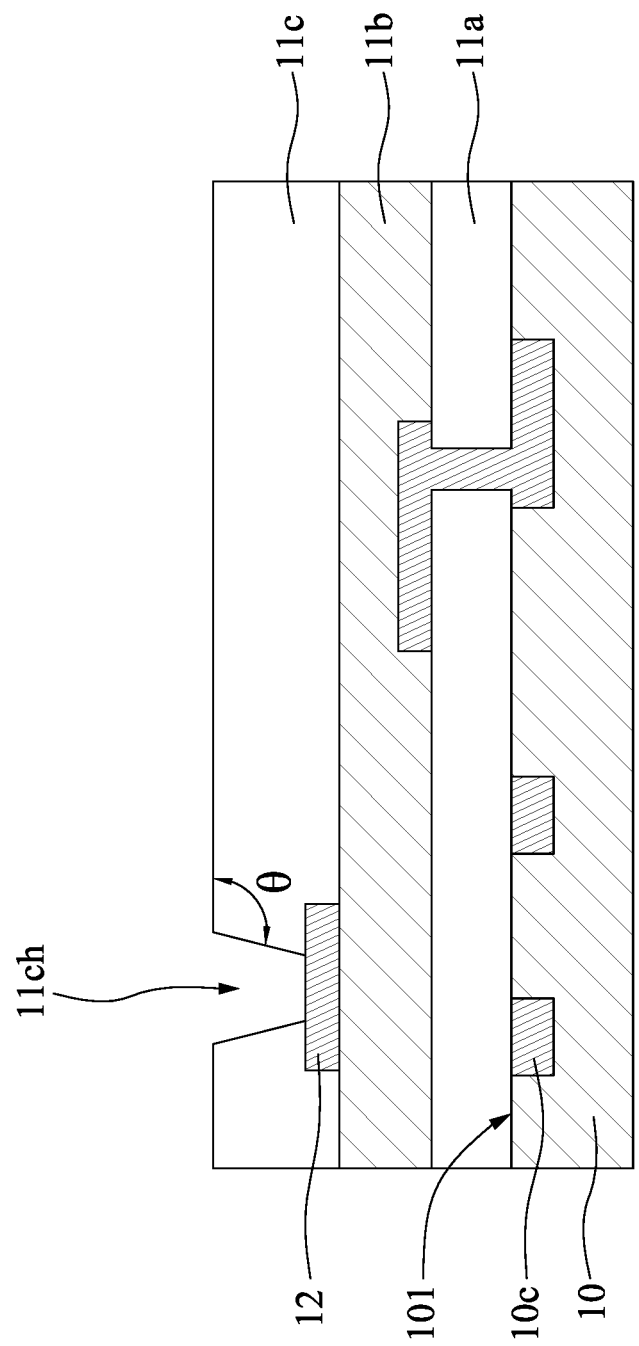
FIG. 4B illustrates one or more stages of a method of manufacturing a bonding pad structure in accordance with some embodiments of the present disclosure.

Referring to FIG. 4B, the dielectric layer 11c may be disposed or formed on the conductive pad 12. In some embodiments, the dielectric layer 11c may be formed by chemical vapor deposition (CVD), plasma-enhanced chemical vapor deposition (PECVD), spin coating or any other suitable operation.

The conductive pad 12 may be protected by the dielectric layer 11c and an opening 11ch may be formed in the dielectric layer 11c to partially expose the conductive pad 12 for subsequent electrical connection. In some embodiments, the opening 11ch may be formed by partially removing the dielectric layer 11c. In some embodiments, the opening 11ch may be formed by photolithography and etching. In some embodiments, the opening 11ch may be formed using reactive ion etching (RIE).

Figure 4C:
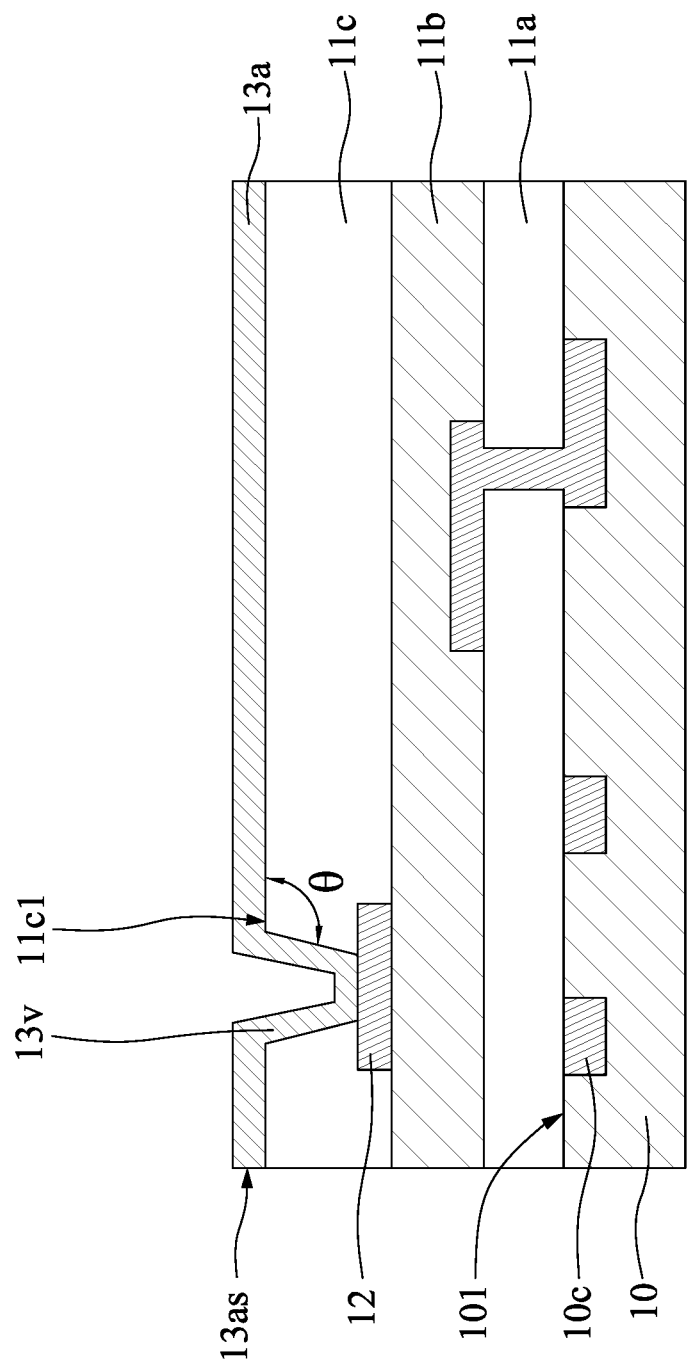
FIG. 4C illustrates one or more stages of a method of manufacturing a bonding pad structure in accordance with some embodiments of the present disclosure.

Referring to FIG. 4C, the conductive layer 13a may be formed or disposed on the dielectric layer 11c. The conductive layer 13a may be conformably formed over the dielectric layer 11c and the opening 11ch, covering the exposed portion of the conductive pad 12.

In some embodiments, the conductive layer 13a may be formed by CVD, PECVD, physical vapor deposition (PVD), evaporation, sputtering, or any other suitable operation. In some embodiments, before forming the conductive layer 13a, an adhesion layer, a barrier layer, and/or a seed layer may be formed or disposed on the dielectric layer 11c.

Figure 4D:
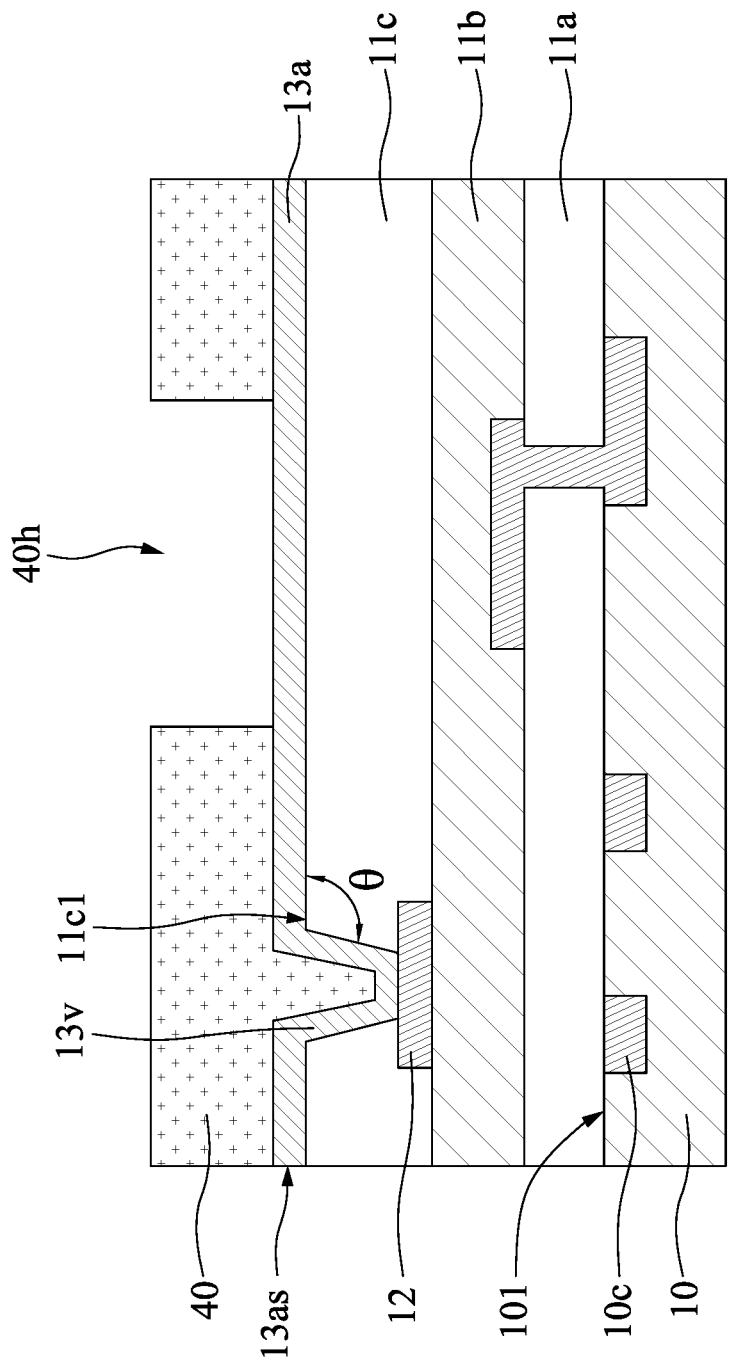
FIG. 4D illustrates one or more stages of a method of manufacturing a bonding pad structure in accordance with some embodiments of the present disclosure.

Referring to FIG. 4D, a mask 40 may be formed or disposed on the conductive layer 13a. The mask 40 may include a photoresist layer.

The mask 40 may include an opening 40h exposing the conductive layer 13a. The method of forming the mask 40 may include first forming a blanket mask layer and then patterning with a photolithography operation. Portions of the blanket mask layer may be removed to define locations for subsequent electrical connection. The size and the location of the opening 40h may be adjusted according to actual need.

Figure 4E:
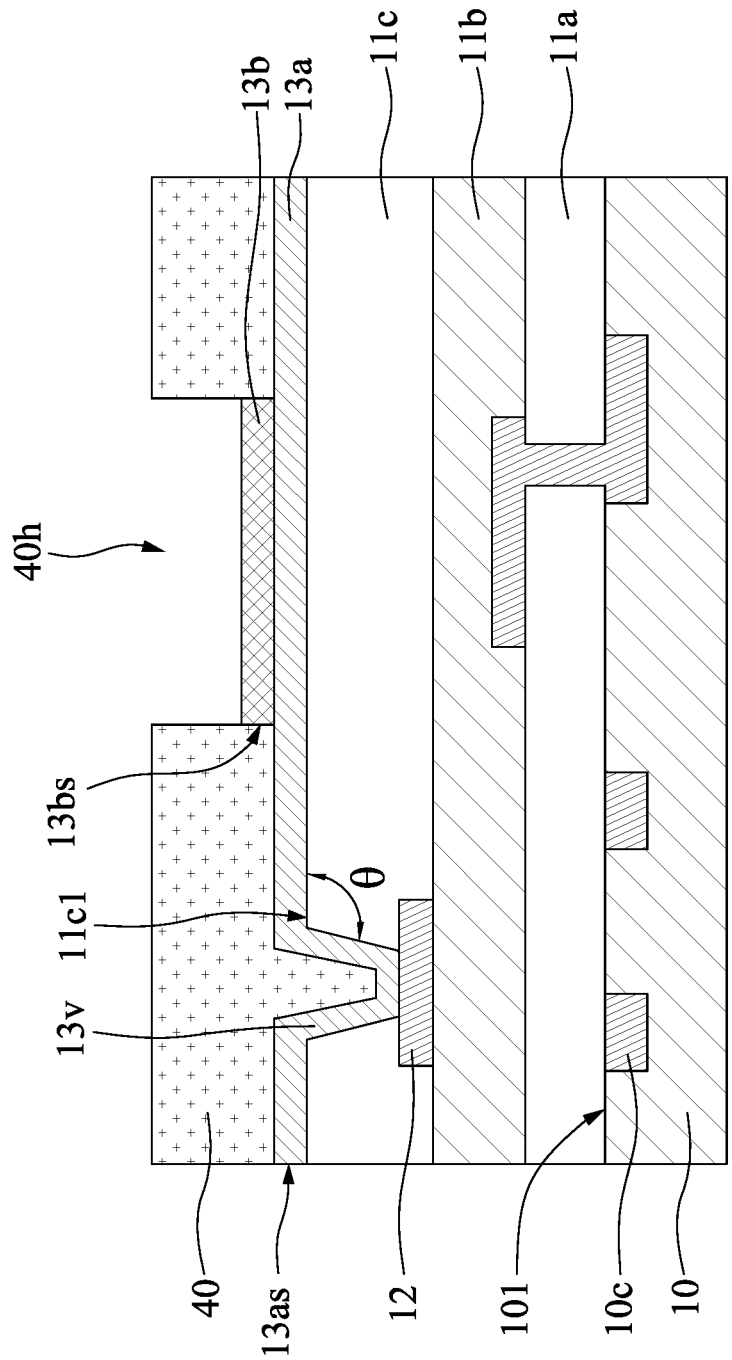
FIG. 4E illustrates one or more stages of a method of manufacturing a bonding pad structure in accordance with some embodiments of the present disclosure.

Referring to FIG. 4E, the conductive layer 13b may be formed or disposed on the conductive layer 13a and in the opening 40h. In some embodiments, the conductive layer 13b may be formed by CVD, PECVD, PVD, evaporation, sputtering, or any other suitable operation.

Figure 4F:
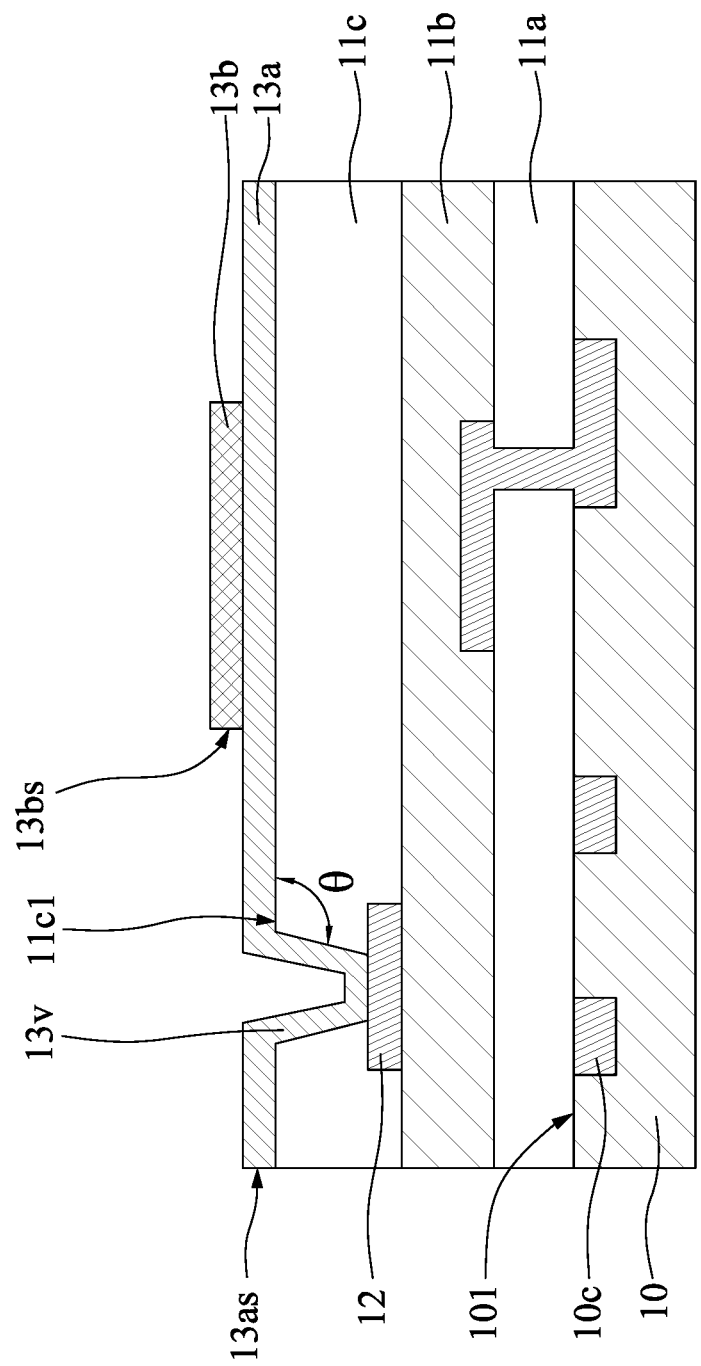
FIG. 4F illustrates one or more stages of a method of manufacturing a bonding pad structure in accordance with some embodiments of the present disclosure.

Referring to FIG. 4F, the mask 40 may be removed by, for example, wet etching. The conductive layers 13a and 13b may be exposed.

Figure 4G:
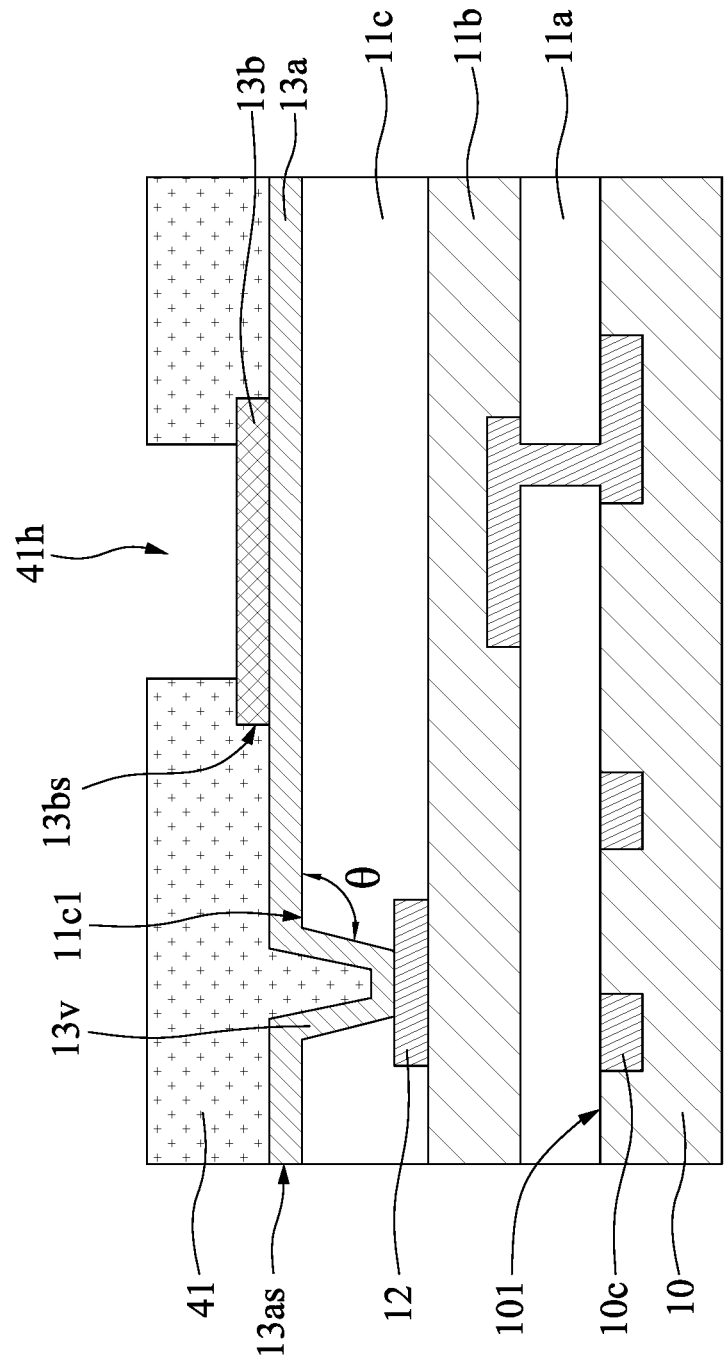
FIG. 4G illustrates one or more stages of a method of manufacturing a bonding pad structure in accordance with some embodiments of the present disclosure.

Referring to FIG. 4G, a mask 41 may be formed or disposed on the conductive layers 13a and 13b. The mask 41 may include a photoresist layer.

The mask 41 may include an opening 41h exposing the conductive layer 13b. The method of forming the mask 41 may include first forming a blanket mask layer and then patterning with photolithography. Portions of the blanket mask layer may be removed to define locations for subsequent electrical connection. The size and the location of the opening 41h may be adjusted according to actual need.

Figure 4H:
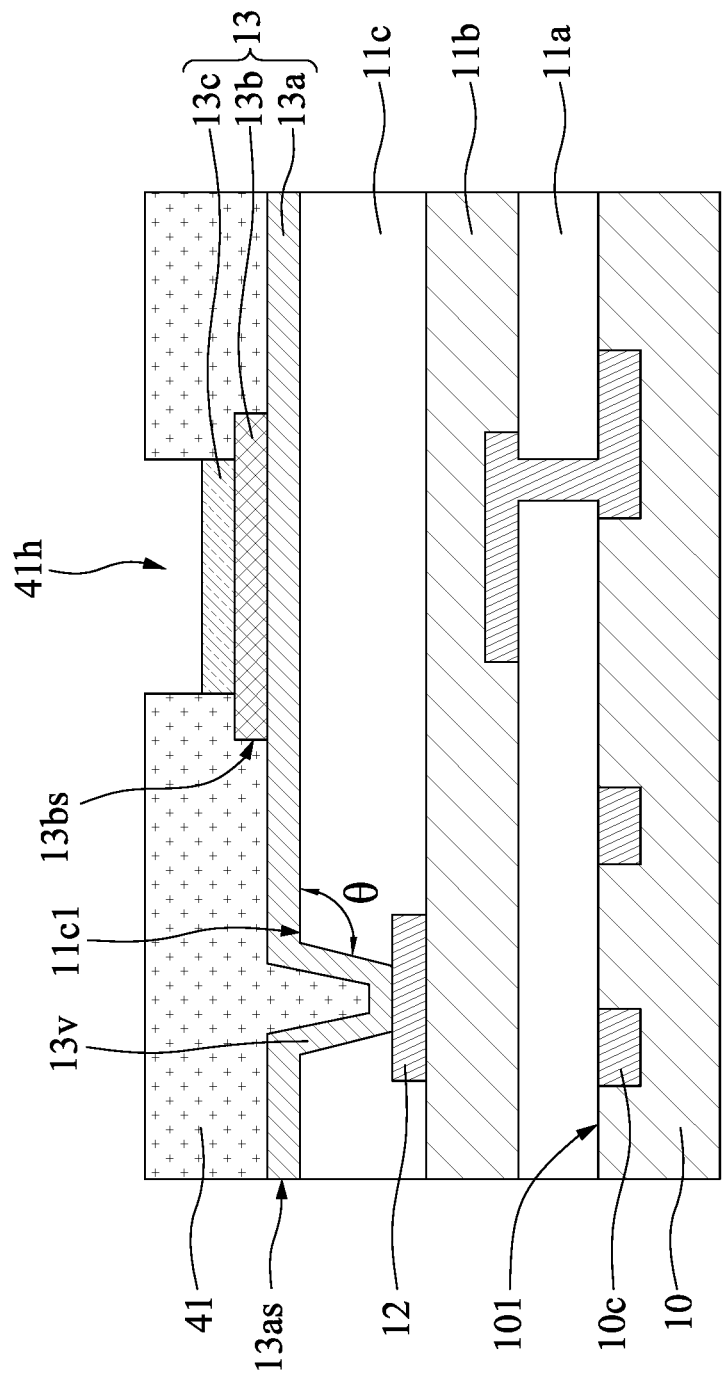
FIG. 4H illustrates one or more stages of a method of manufacturing a bonding pad structure in accordance with some embodiments of the present disclosure.

Referring to FIG. 4H, the conductive layer 13c may be formed or disposed on the conductive layer 13b and in the opening 41h. In some embodiments, the conductive layer 13c may be formed by CVD, PECVD, PVD, evaporation, sputtering, or any other suitable operation.

Figure 4I:
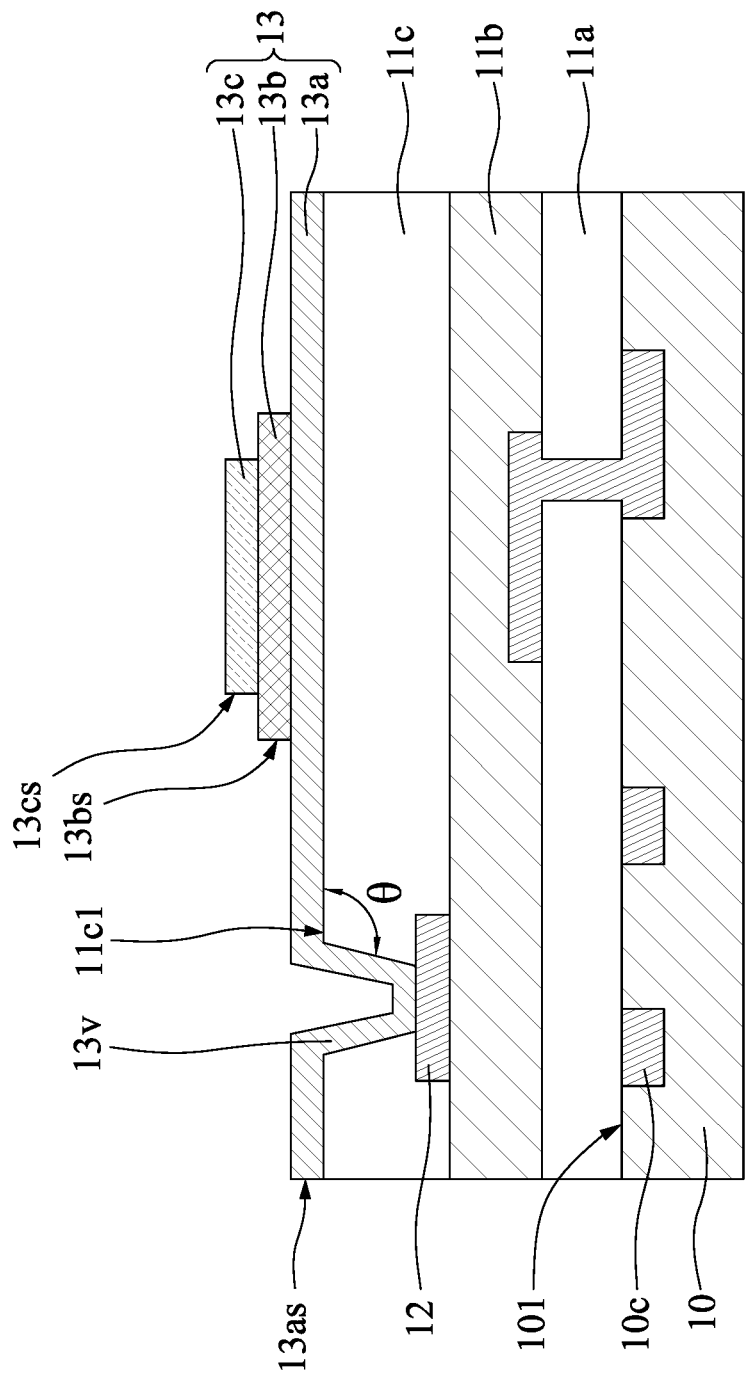
FIG. 4I illustrates one or more stages of a method of manufacturing a bonding pad structure in accordance with some embodiments of the present disclosure.

Referring to FIG. 4I, the mask 41 may be removed by, for example, wet etching. The conductive layers 13a, 13b, and 13c may be exposed.

Figure 4J:
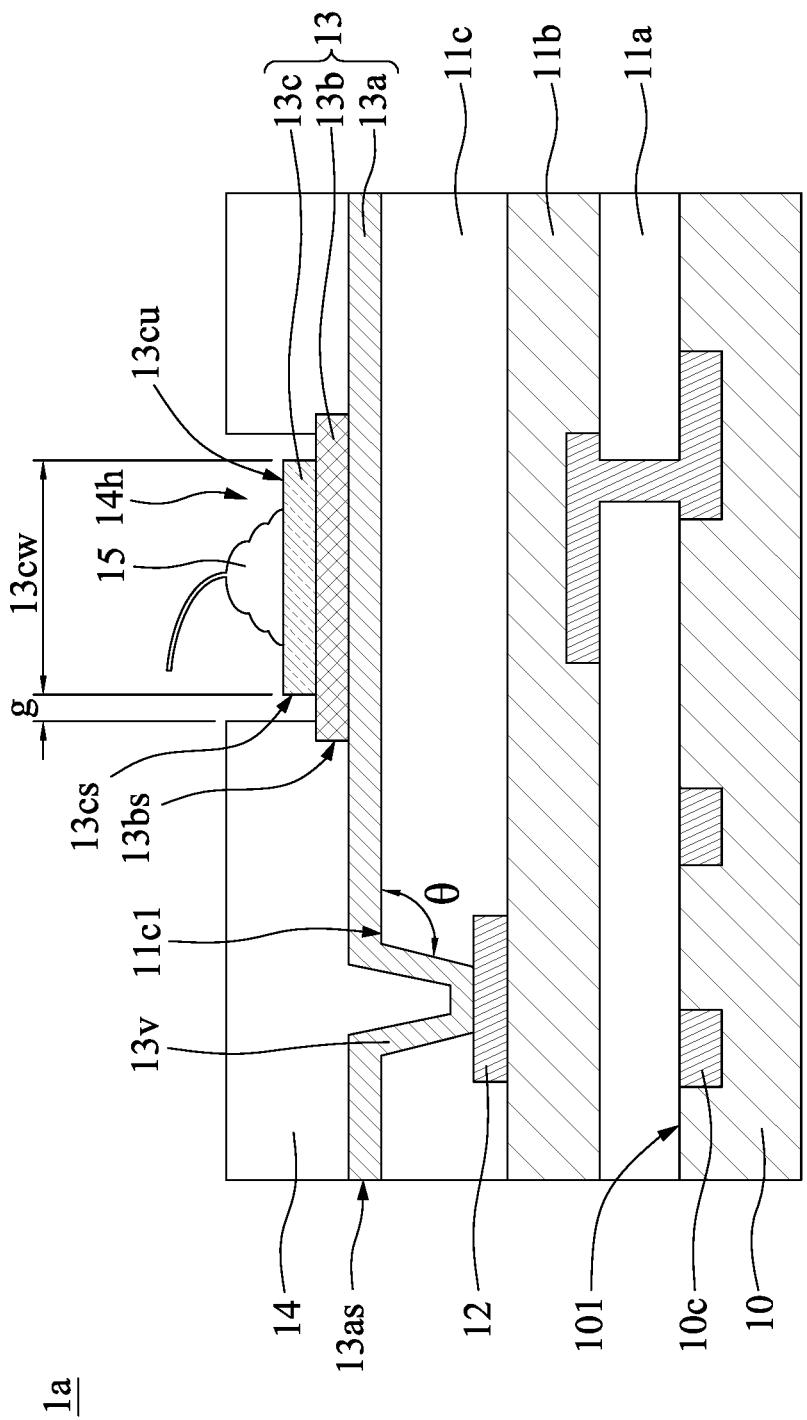
FIG. 4J illustrates one or more stages of a method of manufacturing a bonding pad structure in accordance with some embodiments of the present disclosure.

Referring to FIG. 4J, the passivation layer 14 may be blanketly formed over the conductive layers 13a, 13b, and 13c. The passivation layer 14 may be patterned to form the opening 14h therein by, for example, photolithography, to expose the conductive layer 13c. In some embodiments, the passivation layer 14 may be formed by CVD, PECVD, spin coating, or any other suitable operation. A wire bonding process may be performed to form the conductive bump 15 on the conductive layer 13c.

Figure 5:
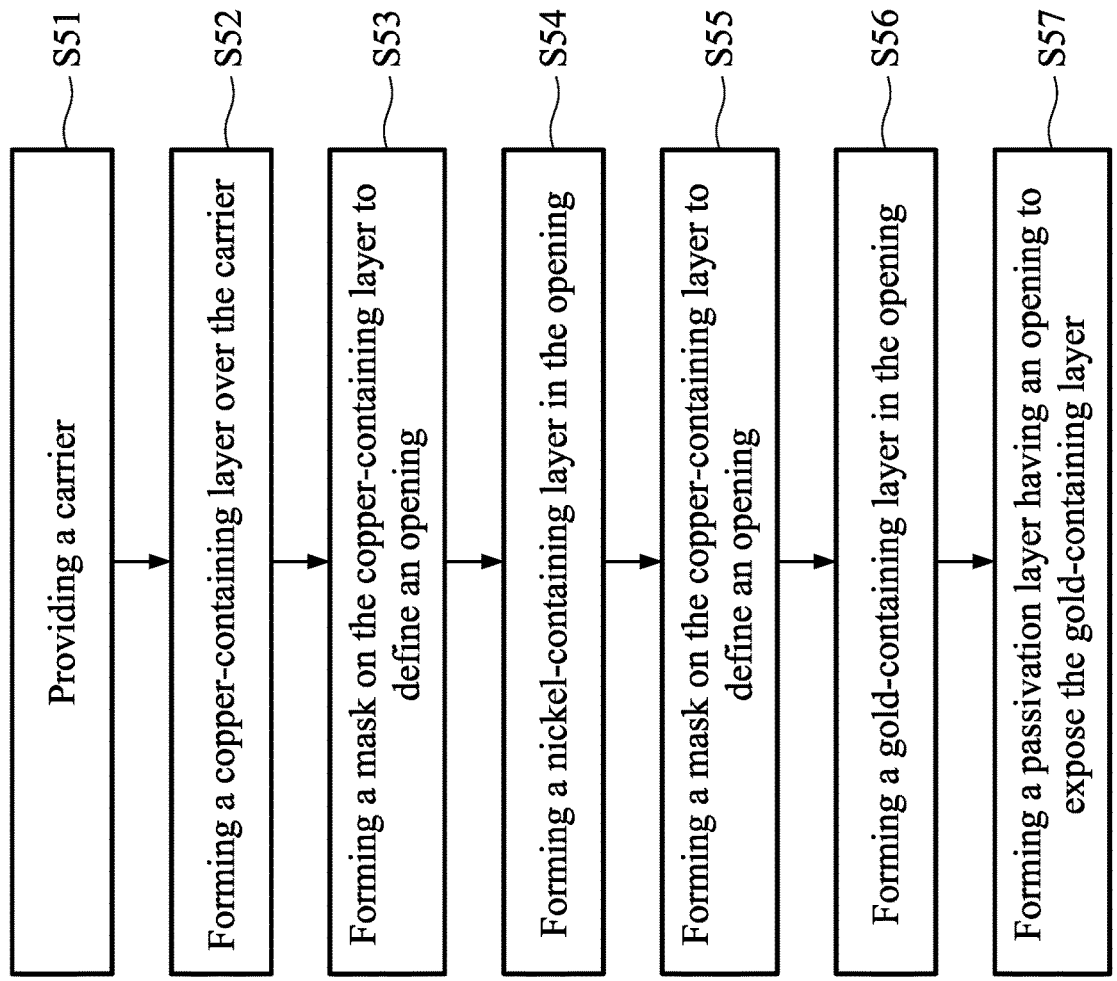
FIG. 5 is a flowchart of a method of manufacturing a bonding pad structure in accordance with some embodiments of the present disclosure.

FIG. 5 is a flowchart of a method 50 of manufacturing a bonding pad structure in accordance with some embodiments of the present disclosure.

In step or operation S51, a carrier is provided.

For example, as shown in FIG. 4A, the carrier 10 may be provided. The dielectric layers 11a and 11b may be stacked on the carrier 10. Metal interconnections 10c may be provided in the carrier between the carrier 10 and the dielectric layer 11a, and/or between the dielectric layers 11a and 11b.

In step or operation S52, a copper-containing layer is formed over the carrier.

For example, as shown in FIG. 4C, the conductive layer 13a may be formed or disposed on the dielectric layer 11c. The conductive layer 13a may be conformably formed over the dielectric layer 11c and the opening 11ch, covering the exposed portion of the conductive pad 12.

In step or operation S53, a mask is formed on the copper-containing layer to define an opening.

For example, as shown in FIG. 4D, the mask 40 may be formed or disposed on the conductive layer 13a. The mask 40 may include an opening 40h exposing the conductive layer 13a.

In step or operation S54, a nickel-containing layer is formed in the opening.

For example, as shown in FIG. 4E, the conductive layer 13b may be formed or disposed on the conductive layer 13a and in the opening 40h.

In step or operation S55, a mask is formed on the copper-containing layer to define an opening.

For example, as shown in FIG. 4G, the mask 41 may be formed or disposed on the conductive layers 13a and 13b. The mask 41 may include an opening 41h exposing the conductive layer 13b.

In step or operation S56, a gold-containing layer is formed in the opening.

For example, as shown in FIG. 4H, the conductive layer 13c may be formed or disposed on the conductive layer 13b and in the opening 41h.

In step or operation S57, a passivation layer is formed, having an opening exposing the gold-containing layer.

For example, as shown in FIG. 4J, the passivation layer 14 may be blanketly formed over the conductive layers 13a, 13b, and 13c. The passivation layer 14 may be patterned to form the opening 14h therein by, for example, photolithography, to expose the conductive layer 13c.

One aspect of the present disclosure provides a bonding pad structure. The bonding pad structure includes a carrier, a first conductive layer disposed over the carrier, a second conductive layer disposed on the first conductive layer and contacting the first conductive layer, and a third conductive layer disposed on the second conductive layer and contacting the second conductive layer. The bonding pad structure also includes a first passivation layer disposed on the first conductive layer and contacting at least one of the first conductive layer or the second conductive layer. An upper surface of the third conductive layer facing away from the carrier is exposed from the first passivation layer.

Another aspect of the present disclosure provides a bonding pad structure. The bonding pad structure includes a dielectric layer having a surface, a copper-containing layer disposed on the surface of the dielectric layer, and a first passivation layer disposed over the copper-containing layer and defining an opening. The bonding pad structure also includes a gold-containing layer disposed in the opening. The gold-containing layer, the copper-containing layer, and the first passivation layer are non-overlapped along a direction substantially perpendicular to the surface of the dielectric layer.

Another aspect of the present disclosure provides a method of manufacturing a bonding pad structure. The method includes providing a carrier, forming a copper-containing layer over the carrier, forming a gold-containing layer over the copper-containing layer, and forming a passivation layer having a first opening to expose the gold-containing layer.

According to some embodiments of the present disclosure, using an RDL having a copper-containing layer and a gold-containing layer can provide better electrical performance. In addition, since the gold-containing layer is not covered by a passivation layer, delamination between the gold-containing layer and the passivation layer can be minimized or prevented. Thus, the reliability of the bonding pad structure can be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A bonding pad structure, comprising:
a carrier;
a first conductive layer disposed over the carrier;
a second conductive layer disposed on the first conductive layer and contacting the first conductive layer;
a third conductive layer disposed on the second conductive layer and contacting the second conductive layer, wherein the second conductive layer is partially covered by the third conductive layer; and
a first passivation layer disposed on the first conductive layer and contacting at least one of the first conductive layer or the second conductive layer,
wherein an upper surface of the third conductive layer facing away from the carrier is exposed from the first passivation layer;
wherein an upper surface of the second conductive layer has a first portion covered by the first passivation layer, a second portion covered by the third conductive layer, and an exposed portion between the first portion and the second portion;
wherein a lateral surface of the second conductive layer is covered by the first passivation layer; and wherein a lateral surface of the third conductive layer is uncovered by and exposed from the first passivation layer.

2. The bonding pad structure of claim 1, wherein the third conductive layer is not disposed between the second conductive layer and the first passivation layer, and wherein the lateral surface of the second conductive layer and the lateral surface of the third conductive layer are not coplanar with each other.

3. The bonding pad structure of claim 1, wherein the first conductive layer, the second conductive layer, and the third conductive layer have materials different from one another, wherein a width of the first conductive layer is less than a width of the second conductive layer which is less than a width of the third conductive layer, and wherein a central line of the second conductive layer is aligned with a central line of the third conductive layer.

4. The bonding pad structure of claim 3, wherein the first conductive layer comprises a copper-containing layer, the second conductive layer comprises a nickel-containing layer, and the third conductive layer comprises a gold-containing layer.

5. The bonding pad structure of claim 1, wherein the first passivation layer has an opening exposing a portion of the second conductive layer, wherein the third conductive layer is disposed within the opening of the passivation layer at a position that a gap is formed between an inner surface of the opening and the lateral surface of the third conductive layer, wherein the third conductive layer is spaced apart from the first passivation layer by the gap between about 1.0 micrometers (μm) and about 3.0 μm, and wherein a width of the exposed portion of the upper surface of the second conductive layer is equal to a width of the gap.

6. The bonding pad structure of claim 1, wherein a width of the third conductive layer is between about 40.0 μm and about 60.0 μm.

7. The bonding pad structure of claim 1, further comprising:
a conductive bump disposed on the third conductive layer.

8. The bonding pad structure of claim 7, wherein the conductive bump comprises a gold bump.

9. The bonding pad structure of claim 1, further comprising:
a conductive pad disposed over the carrier; and
a dielectric layer disposed over the carrier and covering the conductive pad, wherein the first conductive layer penetrates the dielectric layer to contact the conductive pad.

10. The bonding pad structure of claim 1, wherein the first passivation layer contacts the second conductive layer and the first conductive layer, the third conductive layer is physically separated from the first passivation layer, and the lateral surface of the third conductive layer is spaced apart from the lateral surface of the second conductive layer.

11. The bonding pad structure of claim 1, wherein the first passivation layer contacts a lateral surface of the third conductive layer, and the second conductive layer is not exposed from the first passivation layer.

12. The bonding pad structure of claim 1, further comprising:
a second passivation layer disposed between the third conductive layer and the first passivation layer.

13. The bonding pad structure of claim 1, wherein the first conductive layer is physically separated from the first passivation layer by the second conductive layer.

14. The bonding pad structure of claim 1, wherein the second conductive layer is physically separated from the first passivation layer, and a lateral surface of the third conductive layer and a lateral surface of the second conductive layer are substantially coplanar.

* * * * *